United States Patent
Iwasaki et al.

(10) Patent No.: US 9,023,746 B2
(45) Date of Patent: May 5, 2015

(54) OXIDE SINTERED BODY AND SPUTTERING TARGET

(75) Inventors: Yuki Iwasaki, Takasago (JP); Hiroshi Goto, Takasago (JP); Moriyoshi Kanamaru, Takasago (JP)

(73) Assignee: Kobelco Research Institute, Inc., Kobe-shi (JP)

( * ) Notice: Subject to any disclaimer, the term of this patent is extended or adjusted under 35 U.S.C. 154(b) by 0 days.

(21) Appl. No.: 13/982,327

(22) PCT Filed: Feb. 9, 2012

(86) PCT No.: PCT/JP2012/052986
§ 371 (c)(1),
(2), (4) Date: Jul. 29, 2013

(87) PCT Pub. No.: WO2012/108509
PCT Pub. Date: Aug. 16, 2012

(65) Prior Publication Data
US 2013/0313110 A1 Nov. 28, 2013

(30) Foreign Application Priority Data
Feb. 10, 2011 (JP) .................................. 2011-027793

(51) Int. Cl.
*C04B 35/00* (2006.01)
*C23C 14/00* (2006.01)
(Continued)

(52) U.S. Cl.
CPC ........... *C23C 14/086* (2013.01); *C23C 14/3414* (2013.01); *C04B 35/453* (2013.01); *C04B 35/457* (2013.01); *C04B 35/6261* (2013.01);
(Continued)

(58) Field of Classification Search
CPC .................... C04B 2235/3217; C04B 35/505; C23C 14/3414; C23C 14/3407
USPC .................... 501/126; 204/298.13; 252/519.5
See application file for complete search history.

(56) References Cited

U.S. PATENT DOCUMENTS 8,304,359 B2 * 11/2012 Yano et al. .................... 501/126
2007/0215456 A1 9/2007 Abe et al.
(Continued)

FOREIGN PATENT DOCUMENTS

| JP | 2000 256061 | 9/2000 |
| JP | 2007 63649 | 3/2007 |

(Continued)

OTHER PUBLICATIONS

Written Opinion of the International Searching Authority Issued May 1, 2012 in PCT/JP12/052986 Filed Feb. 9, 2012.
(Continued)

*Primary Examiner* — Noah Wiese
(74) *Attorney, Agent, or Firm* — Oblon, McClelland, Maier & Neustadt, L.L.P.

(57) ABSTRACT

Provided is an oxide sintered body suitably used for the production of an oxide semiconductor film for a display device, wherein the oxide sintered body has both high conductivity and relative density, and is capable of depositing an oxide semiconductor film having high carrier mobility. This oxide sintered body is obtained by mixing and sintering powders of zinc oxide, tin oxide and indium oxide, and when an EPMA in-plane compositional mapping is performed on the oxide sintered body the percentage of the area in which Sn concentration is 10 to 50 mass % in the measurement area is 70 area percent or more.

6 Claims, 1 Drawing Sheet

(51) Int. Cl.
*C25B 11/00* (2006.01)
*C25B 13/00* (2006.01)
*C23C 14/08* (2006.01)
*C23C 14/34* (2006.01)
*C04B 35/453* (2006.01)
*C04B 35/457* (2006.01)
*C04B 35/626* (2006.01)
*C04B 35/645* (2006.01)

(52) U.S. Cl.
CPC ....... C04B 35/645 (2013.01); *C04B 2235/3284* (2013.01); *C04B 2235/3286* (2013.01); *C04B 2235/3293* (2013.01); *C04B 2235/604* (2013.01); *C04B 2235/664* (2013.01); *C04B 2235/77* (2013.01)

(56) References Cited

U.S. PATENT DOCUMENTS

| | | | |
|---|---|---|---|
| 2009/0197757 A1 | 8/2009 | Fukushima | |
| 2009/0308635 A1* | 12/2009 | Yano et al. | 174/126.1 |
| 2010/0170696 A1 | 7/2010 | Yano et al. | |
| 2010/0266787 A1* | 10/2010 | Yano et al. | 428/1.1 |
| 2011/0240934 A1 | 10/2011 | Abe et al. | |
| 2013/0001080 A1 | 1/2013 | Abe et al. | |
| 2013/0118774 A1 | 5/2013 | Yano et al. | |

FOREIGN PATENT DOCUMENTS

| | | |
|---|---|---|
| JP | 2007-84842 | 4/2007 |
| JP | 2007 277075 | 10/2007 |
| JP | 2008 63214 | 3/2008 |
| JP | 2010 18457 | 1/2010 |
| JP | 2010 37161 | 2/2010 |
| KR | 2008-0049072 | 6/2008 |
| TW | 201026630 A1 | 7/2010 |
| WO | 2007 037191 | 4/2007 |
| WO | WO 2010/058533 A1 | 5/2010 |
| WO | 2010 067571 | 6/2010 |

OTHER PUBLICATIONS

International Search Report Issued May 1, 2012 in PCT/JP12/052986 Filed Feb. 9, 2012.

* cited by examiner

OXIDE SINTERED BODY AND SPUTTERING TARGET

TECHNICAL FIELD

The present invention relates to an oxide sintered body and a sputtering target used for depositing an oxide semiconductor thin film for a thin film transistor (TFT) by sputtering, which is used for a display device, such as a liquid crystal display or an organic EL display.

BACKGROUND ART

Amorphous (non-crystalline) oxide semiconductors used in a TFT have a high carrier mobility and a large optical bandgap as compared to generalized amorphous silicon (a-Si), and can be deposited at low temperature. Thus, the amorphous oxide semiconductors are expected to be applied to next-generation display devices required for large size, high resolution, and high-speed driving, as well as resin substrates with a low heat resistance, and the like. In formation of the above oxide semiconductor (film), a sputtering method is preferably used which involves a sputtering target made of the same material as the film. The thin film formed by the sputtering method has excellent in-plane uniformity of the composition or thickness in the direction of the film surface (in the in-plane direction) as compared to thin films formed by ion plating, vacuum evaporation coating, and electron beam evaporation. The sputtering method has an advantage that can form the thin film of the same composition as that of the sputtering target. The sputtering target is normally formed by mixing, sintering, and mechanically processing oxide powders.

The compositions of the oxide semiconductor used in the display device include, for example, In-contained amorphous oxide semiconductors, such as "In—Ga—Zn—O, In—Zn—O, or In—Sn—O (ITO)". However, the oxide semiconductor composition contains "In" as a rare metal, which might lead to the increase in material cost during mass production processes. For this reason, another oxide semiconductor appropriate for the mass production is proposed which can reduce the material cost without using the expensive element "In". The oxide semiconductor is a ZTO-based amorphous oxide semiconductor formed by adding "Sn" to "Zn". Patent literatures 1 to 4 disclose sputtering targets useful for manufacturing a ZTO-based oxide semiconductor film.

Patent literature 1 proposes a method for suppressing the occurrence of abnormal discharge or cracking during sputtering by controlling the composition of an oxide sintered body not to contain a tin-oxide phase by burning for a long time. Patent literature 2 proposes a method for suppressing the abnormal discharge during sputtering by performing two-stage processes, namely, a temporary powder burning process at a low temperature of 900 to 1300° C. and a main powder burning process to increase the density of the ZTO-based sintered body. Patent literature 3 proposes a method for improving the conductivity of an oxide sintered body and increasing the density thereof by containing a spinel $AB_2O_4$ compound in the sintered body. Patent literature 4 proposes a method for obtaining a dense ZTO-based sintered body by performing two-stage processes of a temporary power burning process performed at a low temperature of 900 to 1100° C. and a main powder burning process.

Patent literature 5 proposes a ZTO-based sputtering target having a low In content, as a sputtering target for formation of a transparent conductive film which has a low specific resistance and a high relative density even after the decrease in In content of the ITO. In general, when the In content of the ITO is decreased, the relative density of the sputtering target becomes lower, but the specific resistance of the bulk is increased. However, in the technique disclosed in Patent literature 5, a bixbyite structure represented by $In_2O_3$, and a spinel structure represented by $Zn_2SnO_4$ coexist in the target, which achieves the sputtering target having a high density and a small specific resistance, and which can suppress the abnormal discharge in the sputtering.

CITATION LIST

Patent Literature

Patent literature 1: Japanese Unexamined Patent Publication No. 2007-277075
Patent literature 2: Japanese Unexamined Patent Publication No. 2008-63214
Patent literature 3: Japanese Unexamined Patent Publication No. 2010-18457
Patent literature 4: Japanese Unexamined Patent Publication No. 2010-37161
Patent literature 5: Japanese Unexamined Patent Publication No. 2007-63649

SUMMARY OF INVENTION

Technical Problem

A sputtering target used for manufacturing an oxide semiconductor film for a display device, and an oxide sintered body as the material of the sputtering target are required to have excellent conductivity and high relative density. Further, the oxide semiconductor film obtained by using the sputtering target is required to have high carrier mobility. In particular, taking into consideration the productivity and manufacturing cost, the sputtering target is required which can be manufactured not by radio-frequency (RF) sputtering, but by DC sputtering adapted for easy deposition at high speed.

The present invention has been made in view of the above circumstances, and it is an object of the present invention to provide an oxide sintered body and a sputtering target which are suitably used for the production of an oxide semiconductor film for a display device, which have both high conductivity and relative density, and which can deposit an oxide semiconductor film having a high carrier mobility.

Solution to Problem

An oxide sintered body according to the present invention that can solve the above problems is obtained by mixing and sintering powders of zinc oxide, tin oxide, and indium oxide. When an EPMA in-plane compositional mapping is performed on the oxide sintered body, a percentage of an area in which Sn concentration is from 10 to 50 mass % in a measurement area is 70 area % or more.

In a preferred embodiment of the invention, when the EPMA in-plane compositional mapping is performed on the oxide sintered body, a percentage of an area in which In concentration is from 2 to 35 mass % in the measurement area is 70 area % or more.

In another preferred embodiment of the invention, when [Zn], [Sn], and [In] are contents (atomic %) of metal elements contained in the oxide sintered body, a ratio of [In] to [Zn]+[Sn]+[In], and a ratio of [Sn] to [Zn]+[Sn] respectively satisfy the following formulas:

[In]/([Zn]+[Sn]+[In])=0.01 to 0.30; and

[Sn]/([Zn]+[Sn])=0.20 to 0.60.

In another preferred embodiment of the invention, the ratio of [In] to [Zn]+[Sn]+[In], and the ratio of [Sn] to [Zn]+[Sn] respectively satisfy the following formulas:

[In]/([Zn]+[Sn]+[In])=0.10 to 0.30; and

[Sn]/([Zn]+[Sn])=0.33 to 0.60.

In another preferred embodiment of the invention, the oxide sintered body has a relative density of 90% or more, and a specific resistance of 1 Ω·cm or less.

A sputtering target according to the invention that can solve the above problems is obtained using the oxide sintered body according to any one of the above embodiments, so that the sputtering target has a relative density of 90% or more, and a specific resistance of 1 Ω·cm or less.

Advantageous Effects of Invention

The present invention can provide the oxide sintered body and sputtering target having a low specific resistance and a high relative density even when the amount of In as a rare metal is decreased, which leads to a significant decrease in costs of raw material. Further, the present invention can provide the sputtering target that has excellent stability of DC discharge, excellent in-plane uniformity, and more stable properties of the film. The use of the sputtering target of the invention can stably and inexpensively deposit the oxide semiconductor film having a high carrier mobility by the DC sputtering which facilitates the high-speed deposition to thereby improve the productivity of the thin films.

DESCRIPTION OF EMBODIMENTS

Figure 1:
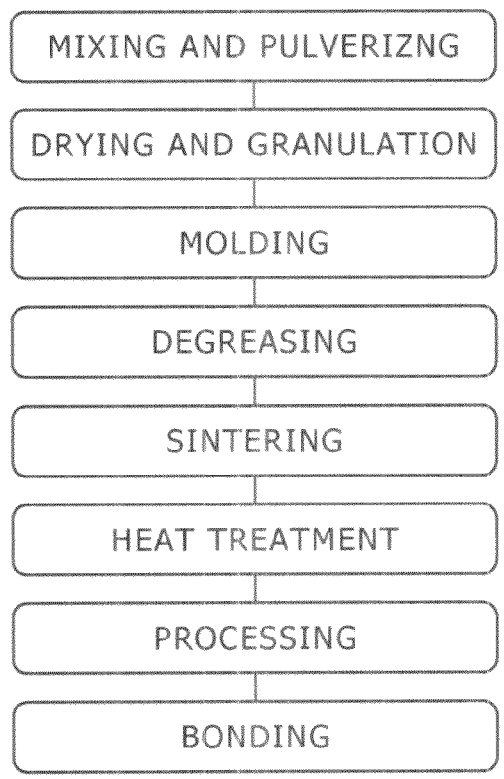
FIG. 1 is a diagram showing basic steps for manufacturing an oxide sintered body and a sputtering target according to the invention.

The inventors have studied about oxide sintered bodies obtained by mixing and sintering powders of zinc oxide, tin oxide, and indium oxide so as to provide the oxide sintered body for a sputtering target having high conductivity (low specific resistance) and relative density, which can be applied to DC sputtering, and which is suitably used for depositing an oxide semiconductor thin film having a high carrier mobility. As a result, the predetermined object is found to be achieved in performing an EPMA (Electron Probe X-ray Micro Analyzer) compositional mapping on the oxide sintered body (A) when a percentage of the area having a Sn concentration of 10 to 50 mass % in a measurement area (400 μm×400 μm) is 70 area % or more, and preferably (B) when a percentage of the area having an In concentration of 2 to 35 mass % in the measurement area is 70 area % or more. In order to obtain the oxide sintered body with such a composition, it is found that predetermined sintering conditions (preferably, sintering at a temperature of 950 to 1650° C.) should be satisfied. The present invention has been made based on the above findings.

Most of the Zn—Sn—In based oxide sintered bodies of interest in the invention exist in the form of a Zn—Sn—In based compound formed by bonding all metal elements (Zn, Sn, and In) contained in the oxide sintered body. Depending on a composition ratio of the metal elements in the sintered body, the sintered body of interest can exist in the form other than the above form. For example, as to the element Sn, when the ratio of [Sn]/([Zr]+[Sn]) is very large, the oxide sintered body often exists in the form of a single Sn or $SnO_2$. Quantitative analysis is performed on the above metal elements by the EPMA compositional mapping, so that the compositions of the compounds existing in the observation field can be substantially identified.

According to the result of studies by the inventors, the following has been found out. In the EPMA analysis under the conditions to be described later, when the percentage of the area ($Sn_{10-50}$) in which the Sn concentration is from 10 to 50 mass % in a measurement area is 70 area % or more; and preferably when the percentage of the area ($In_{2-35}$) in which In concentration is from 2 to 35 mass % in the measurement area is 70 area % or more, ZnO, $SnO_2$, and $In_2O_3$ are distributed substantially uniformly, which largely contributes to the improvement of the relative density of the oxide sintered body (90% or more) and the reduction in specific resistance (1 Ω·cm or less). The result of analysis of the EPMA satisfying the above factors indirectly means that the In—Zn—Sn—O based compound formed of three bonded elements of In, Zn, and Sn contains ZnO, $SnO_2$, and $In_2O_3$ substantially uniformly and occupies 70 area % or more in the measurement area.

When the In—Zn—Sn—O based compound whose Sn concentration and more preferably In concentration are appropriately controlled exists in the In—Zn—Sn—O based oxide sintered body of the invention upon the EPMA compositional mapping, the sputtering target comes to have a high density and a low specific resistance. This mechanism is not known in detail, but the above In—Zn—Sn—O based compound has a low melting point and will form a liquid phase at the time of sintering, which is considered to contribute to the increase in density of the oxide sintered body and also to the decrease in specific resistance.

As to the composition of the above oxide sintered body (sputtering target), $In_2O_3$ is added in a predetermined amount to the oxide sintered body for the ZTO-based oxide semiconductor formed using ZnO and $SnO_2$ as raw material, which improves the relative density of the oxide sintered body and decreases the specific resistance thereof. As a result, it is found that the stable DC discharge can be continuously obtained. Further, the TFT having the oxide semiconductor thin film deposited using the above sputtering target can also be found to have very high-level characteristics, specifically, a carrier density of 15 $cm^2$/Vs or more.

Specifically, when [Zn], [Sn], and [In] are respectively the contents of metal elements (atomic %) contained in the oxide sintered body, preferably, the ratio of [In] to [Zn]+[Sn]+[In] (that is, the [In] ratio) is in a range of 0.01 to 0.30, that is, [In] ratio=0.01 to 0.30, and the ratio of [Sn] to [Zn]+[Sn] (that is, the [Sn] ratio) is in a range of 0.20 to 0.60, that is, [Sn] ratio=0.20 to 0.60. More preferably, [In] ratio=0.10 to 0.30, and [Sn] ratio=0.33 to 0.60. In the above Patent literature 5, in order to set the composition of the sputtering target appropriate for deposition of the transparent conductive film, the [In] ratio is set more than the above range, and the [Sn] ratio is set lower than the above range. The preferable composition ratio disclosed in Patent literature 5 described above differs from that of the present invention that can provide the oxide sintered body and sputtering target appropriate for the deposition of the oxide semiconductor thin film.

Now, the components of the oxide sintered body in the invention will be described in detail.

The composition of the above oxide sintered body observed with the EPMA will be described below. Color mapping with the EPMA can easily identify the in-plane element distribution of the sputtering target at one view.

When performing the in-plane compositional mapping on the oxide sintered body with the EPMA under the conditions to be described later, the composition of the invention defined by the Sn concentration, and further preferably the In concentration can satisfies the following (A), and more preferably (B).

(A) The percentage of the area in which Sn concentration is from 10 to 50 mass % in the measurement area is 70 area % or more.

(B) Preferably, the percentage of the area in which In concentration is 2 to 35 mass % in the measurement area is 70 area % or more.

The area in which Sn concentration is from 10 to 50 mass % is hereinafter referred to as a "$Sn_{10\text{-}50}$", and the area in which In concentration is 2 to 35 mass % is hereinafter referred to as a "$In_{2\text{-}35}$".

The measurement conditions for the EPMA in the invention will be as follows.

Analyzer: "Electron Probe Microanalyser JXA8900RL" manufactured by JEOL
Analysis Conditions
Accelerating Voltage: 15.0 kV
Illumination Current: $5.012 \times 10^{-8}$ A
Beam Diameter: minimum (0 μm)
Measurement Time: 100.00 ms
Measurement Points: 400×400
Measurement Distance: 1 μm
Measurement Area: 400 μm×400 μm
Measurement Position Center in the thickness direction of plate
Number of Fields of Views for Measurement: one field (A) The percentage of the area in which Sn concentration is from 10 to 50 mass % in the measurement area is 70 area % or more.

In the oxide sintered body of the invention, the percentage of the area $Sn_{10\text{-}50}$ in which Sn concentration is from 10 to 50 mass % in the measurement area is controlled to be 70 area % or more. Thus, ZnO, $SnO_2$, and $In_2O_3$ are distributed substantially uniformly, which increases the amount of the In—Zn—Sn—O based compounds largely contributing to the improvement of the relative density of the oxide sintered body and the decrease in specific resistance thereof. With the above arrangement, even when the In content is small (note that as will be described later, in the invention, the preferable range of the [In] ratio is 0.01 to 0.30, and more preferably in a range of 0.10 to 0.30), the oxide sintered body of the invention can achieve the low specific resistance (1 Ω·cm or less), and the high relative density (90% or more).

The invention does not intend to strictly control areas other than the above area ($Sn_{10\text{-}50}$). Upon performing the EPMA mapping on the oxide sintered body of the invention under the above conditions, the percentage of the area $Sn_{>50}$ in which Sn concentration exceeds 50 mass % in the measurement area is preferably equal to or less than 20 area %. The area percentage of the above area $Sn_{>50}$ is controlled to be 20% or less, which can improve the stability of the DC discharge of the sputtering to achieve the stable discharge.

In the above area $Sn_{>50}$, neither Zn nor In is detected, so that substantially all parts of the oxide sintered body in the area is supposed to exist in the form of $SnO_2$. As mentioned above, not only the In—Zn—Sn—O based compound, but also $SnO_2$ is often detected depending on the ratio of metal elements included in the oxide sintered body (for example, when the ratio of [Zn]/[Zn]+[Sn] is very small). However, the small amount of $SnO_2$ does not adversely affect the stability of the DC discharge of the sputtering, and the properties of the semiconductor thin film after the deposition, which has been confirmed by experiments.

When an EPMA mapping is performed on the oxide sintered body of the invention under the above conditions, the percentage of the area $Sn_{<10}$ in which Sn concentration is less than 10 mass % in the measurement area is preferably 10 area % or less. The area percentage of the above area $Sn_{<10}$ is controlled to be 10% or less, which improves the stability of the DC discharge of the sputtering, and the properties of the semiconductor thin film after the deposition.

The above area $S_{n<10}$ is determined to be formed of pores (voids) by a secondary electron image taken by the EPMA. As mentioned above, in the invention, the area percentage of the above area $S_{n<10}$ is controlled to a small amount, preferably 10% or less. The small amount of pores does not adversely affect the stability of the DC discharge of the sputtering, and the properties of the semiconductor thin film after the deposition, which has been confirmed by experiments.

(B) The percentage of the area in which In concentration is 2 to 35 mass % is 70 area % or more.

In the oxide sintered body of the invention, the percentage of the area $In_{2\text{-}35}$ in which In concentration is from 2 to 35 mass % is controlled to be 70 area % or more in the measurement area. Most of the area in which In concentration is from 2 to 35 mass % is superimposed over the area in which Sn concentration is from 10 to 50 mass %. Thus, satisfying the above condition (B) substantially means that the above In—Zn—Sn—O based compounds exist in a large amount (of 70 area % or more) in the measurement area.

The invention does not intend to strictly control areas other than the above region ($In_{2\text{-}35}$). When the EPMA mapping is performed on the oxide sintered body of the invention under the above conditions, the percentage of the area $In_{>35}$ in which In concentration exceeds 35 mass % in the measurement area is preferably 25 area % or less. The area percentage of the above area $In_{>35}$ is controlled to be 25 area % or less, which can improve the stability of the DC discharge of the sputtering to achieve the stable discharge.

In the above area $In_{>35}$, Zn is detected together with In (at the same time), so that substantially all parts of the oxide sintered body in the area is supposed to exist in the form of In—Zn—O based compound. This chemical compound is the so-called homologous compound, and has good characteristics as electron material, for example, a low electric resistance, and changes its properties with the change in crystal structure. In the invention, the above compound contributes to the reduction in specific resistance of the oxide sintered body, and thus does not adversely affect the stability of the DC discharge of the sputtering, and the properties of the semiconductor thin film after the deposition.

When the EPMA matting is performed on the oxide sintered body of the invention under the above conditions, the percentage of the area $In_{<2}$ in which In concentration is less than 2 mass % in the measurement area is preferably 5 area % or less. The area percentage of the above area $In_{<2}$ is controlled to be 5% or less, which improves the stability of the DC discharge of the sputtering, and the properties of the semiconductor thin film after the deposition.

Like the above area $Sn_{<10}$, the area $In_{<2}$ is determined to be formed of pores (voids) by a secondary electron image taken by the EPMA. As mentioned above, in the invention, the area percentage of the above area $In_{<2}$ is controlled to a small amount, preferably 5% or less. The small amount of pores does not adversely affect the stability of the DC discharge of the sputtering, and the properties of the semiconductor thin film after the deposition, which has been confirmed by experiments.

Now, a preferable composition ratio (atomic ratio) of metal elements contained in the oxide sintered body of the invention will be described. In the following, the ratio of [In] to [Zn]+[Sn]+[In] will be referred to as the [In] ratio, and the ratio of [Sn] to [Zn]+[Sn] will be referred to as the [Sn] ratio as mentioned above.

The [In] ratio is preferably in a range of 0.01 to 0.30. For the [In] ratio of less than 0.01, the relative density of the oxide sintered body cannot be improved and the specific resistance of the oxide sintered body cannot be reduced, which leads to a decrease in carrier mobility of the thin film after the deposition using the oxide sintered body. In contrast, for the [In] ratio exceeding 0.30, the TFT switching characteristics of the thin film are degraded. The [In] ratio is more preferably in a range of 0.10 to 0.30. Further, preferably the upper limit of the [In] ratio is 0.25 or less.

The [Sn] ratio is preferably in a range of 0.20 to 0.60. When the [Sn] ratio is outside the above range, the switching characteristics of the TFT are degraded, which cannot provide a high-performance display device. The [Sn] ratio is more preferably in a range of 0.33 to 0.60.

The oxide sintered body of the invention satisfies the following characteristics: the relative density of 90% or more, and the specific resistance of 1 $\Omega$·cm or less.

(Relative Density of 90% or More)

The oxide sintered body of the invention has a very high relative density, preferably 90% or more, and more preferably 95% or more. The high relative density can prevent the occurrence of cracking or nodules during sputtering, and can advantageously continuously keep the discharge stable until the target life.

(Specific Resistance of 1 $\Omega$·cm or Less)

The oxide sintered body of the invention has a small specific resistance, preferably, of 1 $\Omega$·cm or less, and more preferably, of 0.1 $\Omega$·cm or less. This setting allows the deposition by the DC sputtering method of plasma discharge using a DC power supply. As a result, the physical vapor deposition (sputtering) using a sputtering target can be effectively performed on a production line of the display devices.

Next, a method for manufacturing the oxide sintered body according to the invention will be described below.

The oxide sintered body of the invention is obtained by mixing and sintering powders of zinc oxide, tin oxide, and indium oxide. Basic steps from the powders of raw material up to the sputtering target are shown in FIG. 1. FIG. 1 illustrates the basic steps in which the oxide sintered body obtained by mixing and pulverizing, drying and granulation, molding, degreasing, sintering, and applying heat treatment to powders of oxides in that order is further processed and bonded to produce a sputtering target. The heat treatment after the sintering is applied if necessary, but may be omitted. In the invention, the sintering conditions are appropriately controlled in the sintering step among the above steps as will be described later in detail. Other steps are not limited to specific ones, and can be performed by normal processes appropriately selected. Now, the respective steps will be described below, but the invention is not limited thereto.

First, zinc oxide powder, tin oxide powder, and indium oxide powder are blended at a predetermined blending ratio, mixed, and pulverized. The purity of each of the raw material powders used is preferably about 99.99% or more. Even the presence of a small amount of impurity element might degrade the semiconductor properties of the oxide semiconductor film. The blending ratio of the raw material powders is preferably controlled such that the ratio of each of Zn, Sn, and In is within the above corresponding range.

The mixing and pulverizing processes are preferably performed using a pot mill, into which the raw material powders are charged with water. Balls and beads used in the steps are preferably formed of, for example, nylon, alumina, zirconia, and the like. The mixing time is preferably 2 hours or more, more preferably 10 hours or more, and most preferably 20 hours or more.

Then, the mixed powders obtained in the above steps are dried and granulated, and thereafter molded. In molding, preferably the powders after the drying and granulation are charged into a die having a predetermined size, preformed by die pressing, and then molded by CIP (cold isostatic press) or the like. In order to increase the relative density of the sintered body, the molding pressure in the preforming step is preferably controlled to about 0.2 tonf/cm$^2$ or more, and the pressure in the molding is preferably controlled to about 1.2 tonf/cm$^2$ or more.

Then, the thus-obtained molded body is sintered. In the invention, in order to obtain a desired composition, the sintering is preferably performed at a temperature of about 950 to 1650° C. As the temperature of sintering becomes higher, the In—Zn—Sn—O based compound is likely to be formed, and also the molded body can be sintered for a shorter time, which is preferable. As the sintering temperature is excessively high, the sintered body is apt to be decomposed, which reduces the relative density of the sintered body. As the sintered temperature is excessively low, the above In—Zn—Sn—O based compound is less likely to be formed, which cannot provide the desired composition. Thus, the sintering conditions are preferably within the above ranges. The sintering temperature is more preferably in a range of about 1000 to 1600° C. The above sintering process decreases the specific resistance of the sintered body, for example, from about 100 $\Omega$·cm (before the sintering) to 0.1 $\Omega$·cm (after the sintering).

When the above method makes it difficult to obtain the desired relative density, in order to more easily achieve the desired relative density, the powders dried and granulated are charged into the die having a determined size, and preformed by die pressing. Preferably, the molded body is charged into a graphitic die, and sintered in the graphitic die while being pressed. At this time, the powders may be directly charged into the graphitic die without the preforming step by the die press to be pressed and sintered.

Then, the thus-obtained sintered body is subjected to the heat treatment if necessary, which produces the oxide sintered body of the invention. The heat treatment is performed to further reduce the specific resistance so as to enable the plasma discharge using the DC power supply. Preferable heat treatment conditions are as follows: heat treatment temperature of about 700° C. or more; and holding time of about 2 hours or more. More preferable heat treatment conditions are as follows: heat treatment temperature of about 800° C. or more; and holding time of about 4 hours or more. A heat treatment atmosphere is preferably a reducing atmosphere. For example, the atmosphere is preferably adjusted by introducing nitrogen gas into a furnace.

After obtaining the oxide sintered body in the way described above, the steps of processing and bonding by normal methods can produce the sputtering target of the invention. The thus-obtained sputtering target also has very good relative density and specific resistance, like the oxide sintered body. A preferable relative density of the sputtering target is about 90% or more, and a preferable specific resistance of the sputtering target is about 1 Ω·cm or less.

Examples

Now, the present invention will be more specifically described with reference to examples below. However, the invention is not limited to the following examples, and various changes can be appropriately made to the examples so as to comply with the spirit of the invention, and any one of the examples can fall within the technical scope of the invention.

Example 1

Zinc oxide powder having a purity of 99.99%, tin oxide powder having a purity of 99.99%, and indium oxide powder having a purity of 99.99% were blended at the ratio of [Zn]:[Sn]:[In]=40.0:40.0:20.0, and mixed by a nylon ball mill for 20 hours. Then, the mixed powders obtained in the above process were dried and granulated, preformed at a molding pressure of 0.5 tonf/cm² by the die press, and then mainly molded at a molding pressure of 3 tonf/cm² by the CIP. The thus-obtained molded body was held at 1500° C. and sintered.

Figure 2:
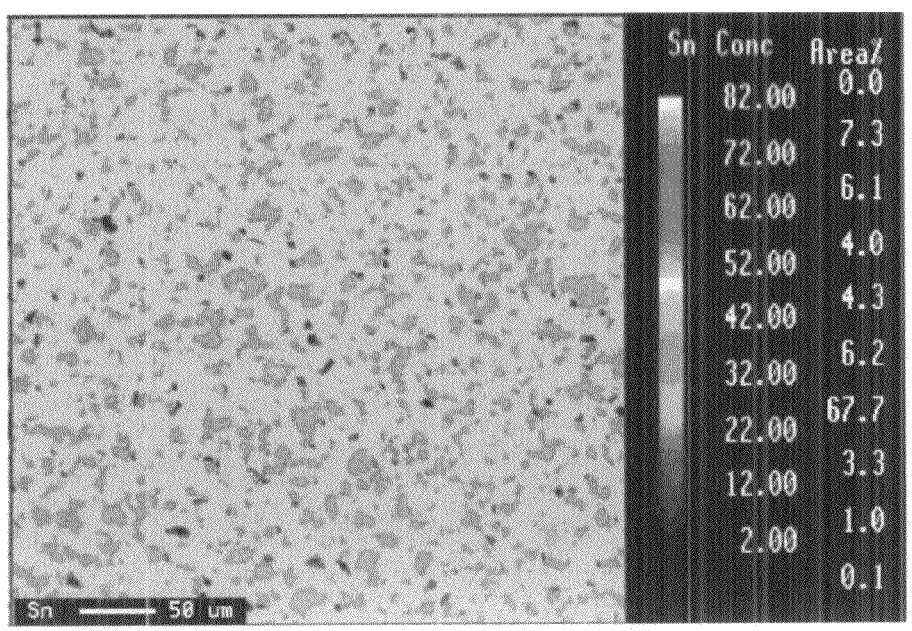
FIG. 2 is a diagram showing the result of an EPMA compositional mapping about the Sn concentration of the oxide sintered body in Example 1 of the invention.

Mapping of Sn concentration was performed on the thus-obtained oxide sintered body of Example 1 (size: φ135 mm×7 mmt) under the above-mentioned EPMA mapping conditions. The results of the mapping were shown in FIG. 2 and No. 1 of Table 1. As shown in FIG. 2 and Table 1, the area percentage of the area in which Sn concentration was from 10 to 50 mass % in the oxide sintered body was 80%, which satisfied the scope (70% or more) of the invention. The area percentage of the area in which In concentration is 2 to 35 mass % also satisfied the preferable scope (70% or more) of the invention.

Further, the above sintered body was processed into a piece having φ4 inch×5 mmt, which was bonded to a backing plate to produce the sputtering target. The thus-obtained sputtering target was mounted to sputtering equipment, and then DC (direct current) magnetron sputtering was performed. The sputtering conditions were as follows: DC sputtering power of 150 W, Ar/0.1 vol. % $O_2$ atmosphere, and pressure of 0.8 mTorr. As a result, the occurrence of the abnormal discharge (arcing) was not observed and the stable discharge was confirmed.

The relative density of the thus-obtained sputtering target was measured to be 91% or more by Archimedes' method. The specific resistance of the sputtering target was measured by a four-probe method to be $8.4 \times 10^{-3}$ Ω·cm. Both results were good.

A thin film deposited under the above sputtering conditions was used to make a thin film transistor with a channel length 10 μm and a channel width 100 μm. Then, the carrier mobility of the transistor was measured. As a result, the high carrier mobility of 15 cm²/Vs or more was obtained.

Example 2

The above powders of the raw materials used in the above Example 1 were blended at the ratio of [Zn]:[Sn]:[In]=40.0:40.0:20.0, and mixed by a nylon ball mill for 20 hours. Then, the mixed powders obtained in the above process were dried and granulated, and preformed at a molding pressure of 0.5 tonf/cm² by the die press. Then, the molded body was charged into a graphitic die, and pressed at 30 MPa and sintered while being kept at 1100° C. in the graphitic die, which produced the oxide sintered body of Example 2.

The results are shown in a specimen No. 2 of Table 1. As shown in Table 1, the area percentage of the area in which Sn concentration was from 10 to 50 mass % in the oxide sintered body was 91%, which satisfied the scope (of 70% or more) of the invention. The area percentage of the area in which In concentration was from 2 to 35 mass % also satisfied the preferable scope (of 70% or more) of the invention.

Further, the above sintered body was used for sputtering in the same way as Example 1, so that the stable discharge was confirmed. The relative density and specific resistance of the thus-obtained sputtering target were measured in the same way as the above Example 1. The sputtering target of this example was determined to have the relative density of 97% or more and the specific resistance of $5.3 \times 10^{-3}$ Ω·cm, which were good results. The thin film deposited under the above sputtering conditions was used to measure a carrier mobility in the same way as in Example 1. The carrier mobility was determined to be a high value, specifically, 15 cm²/Vs or more.

Example 3

Example 3 produced the oxide sintered body in the same way as Example 1 except that the above powders of the raw materials were blended at the ratio of [Zn]:[Sn]:[In]=48.0:32.0:20.0, and that after being sintered at 1600° C., a molded body was subjected to heat treatment at 900° C. for 6 hours in a nitrogen gas atmosphere.

TABLE 1

| | Composition ratio | | | Sintering temperature | Area percentage (%) of area in which Sn concentration is from 10 to 50 mass % by the EPMA mapping | Area percentage (%) of area in which In concentration is from 2 to 35 mass % by the EPMA mapping | Characteristics of sintered body | |
|---|---|---|---|---|---|---|---|---|
| No. | [In] ratio | [Zn] ratio | [Sn] ratio | (C. °) | | | Relative density (%) | Specific resistance (Ω · cm) |
| 1 | 0.20 | 0.50 | 0.50 | 1500 | 80 | 81 | 91 | $8.4 \times 10^{-3}$ |
| 2 | 0.20 | 0.50 | 0.50 | 1100 | 91 | 85 | 97 | $5.3 \times 10^{-3}$ |
| 3 | 0.20 | 0.60 | 0.40 | 1600 | 93 | 92 | 95 | $5.0 \times 10^{-3}$ |
| 4 | 0.20 | 0.67 | 0.33 | 1050 | 94 | 96 | 98 | $2.9 \times 10^{-3}$ |
| 5 | 0.10 | 0.50 | 0.50 | 1150 | 83 | 71 | 97 | $1.6 \times 10^{-2}$ |
| 6 | 0.03 | 0.50 | 0.50 | 1075 | 82 | 62 | 92 | $3.0 \times 10^{-2}$ |
| 7 | 0.30 | 0.50 | 0.50 | 1450 | 92 | 75 | 98 | $2.6 \times 10^{-3}$ |
| 8 | 0.20 | 0.80 | 0.20 | 1300 | 72 | 97 | 98 | $2.7 \times 10^{-3}$ |
| 9 | 0.20 | 0.50 | 0.50 | 800 | 64 | 58 | 60 | 97 |

* [In] ratio = [In]/([Zn] + [Sn] + [In]), [Zn] ratio = [Zn]/([Zn] + [Sn]), [Sn] ratio = [Sn]/([Zn] + [Sn])

The results are shown in a specimen No. 3 of Table 1. As shown in Table 1, an area percentage of the area in which Sn concentration was 10 to 50 mass % in the oxide sintered body was 93%, which satisfied the scope (of 70% or more) of the invention. An area percentage of the area in which In concentration was 2 to 35 mass % also satisfied the preferable scope of the invention (of 70% or more).

Further, the above sintered body was used for sputtering in the same way as Example 1, so that the stable discharge was confirmed. The relative density and specific resistance of the thus-obtained sputtering target were measured in the same way as the above Example 1. The sputtering target of this example was determined to have the relative density of 95% and the specific resistance of $5.0 \times 10^{-3}$ Ω·cm, which were good results. The thin film deposited under the above sputtering conditions was used to measure a carrier mobility in the same way as in Example 1. The carrier mobility was determined to be a high value, specifically, 15 cm$^2$/Vs or more.

Example 4

The above powders of the raw materials used in the above Example 1 were blended at the ratio of [Zn]:[Sn]:[In]=53.3:26.7:20.0, and mixed by a nylon ball mill for 20 hours. Then, the mixed powders obtained in the above process were dried and granulated, and preformed at a molding pressure of 0.5 tonf/cm$^2$ by the die press. Then, the molded body was charged into a graphitic die, and pressed and sintered at 30 MPa while being kept at 1050° C. in the graphitic die, which produced the oxide sintered body of Example 4.

The results are shown in a specimen No. 4 of Table 1. As shown in Table 1, an area percentage of the area in which Sn concentration was 10 to 50 mass % in the oxide sintered body was 94%, which satisfied the scope (of 70% or more) of the invention. An area percentage of the area in which In concentration was 2 to 35 mass % also satisfied the preferable scope of the invention (of 70% or more).

Further, the above sintered body was used for sputtering in the same way as Example 1, so that the stable discharge was confirmed. The relative density and specific resistance of the thus-obtained sputtering target were measured in the same way as the above Example 1. The sputtering target of this example was determined to have the relative density of 98% and the specific resistance of $2.9 \times 10^{-3}$ Ω·cm, which were good results. The thin film deposited under the above sputtering conditions was used to measure a carrier mobility in the same way as in Example 1. The carrier mobility was determined to be a high value, specifically, 15 cm$^2$/Vs or more.

Example 5

The above powders of the raw materials used in the above Example 1 were blended at the ratio of [Zn]:[Sn]:[In]=45.0:45.0:10.0, and mixed by a nylon ball mill for 20 hours. Then, the mixed powders obtained in the above steps were dried and granulated, and preformed at a molding pressure of 0.5 tonf/cm$^2$ by the die press. Then, the molded body was charged into a graphitic die, and pressed at 30 MPa and sintered while being kept at 1150° C. in the graphitic die, which produced the oxide sintered body of Example 5.

The results are shown in a specimen No. 5 of Table 1. As shown in Table 1, an area percentage of the area in which Sn concentration was 10 to 50 mass % in the oxide sintered body was 83%, which satisfied the scope (of 70% or more) of the invention. An area percentage of the area in which In concentration was 2 to 35 mass % also satisfied the preferable scope of the invention (of 70% or more).

Further, the above sintered body was used for sputtering method in the same way as Example 1, so that the stable discharge was confirmed. The relative density and specific resistance of the thus-obtained sputtering target were measured in the same way as the above Example 1. The sputtering target of this example was determined to have the relative density of 97% and the specific resistance of $1.6 \times 10^{-2}$ Ω·cm, which were good results. The thin film deposited under the above sputtering conditions was used to measure a carrier mobility in the same way as in Example 1. The carrier mobility was determined to be a high value, specifically, 15 cm$^2$/Vs or more.

Example 6

The above powders of the raw materials used in the above Example 1 were blended at the ratio of [Zn]:[Sn]:[In]=48.5:48.5:3.0, and mixed by a nylon ball mill for 20 hours. Then, the mixed powders obtained in the above process were dried and granulated, and preformed at a molding pressure of 0.5 tonf/cm$^2$ by the die press. Then, the molded body was charged into a graphitic die, and pressed at 30 MPa and sintered while being kept at 1075° C. in the graphitic die, which produced the oxide sintered body of Example 6.

The results are shown in a specimen No. 6 of Table 1. As shown in Table 1, an area percentage of the area in which Sn concentration was 10 to 50 mass % in the oxide sintered body was 82%, which satisfied the scope (of 70% or more) of the invention. However, the specimen No. 6 had a low concentration of In ([In] ratio=0.03) as compared to other examples. Since the percentage of an area having a very low concentration of In in the In—Zn—Sn—O based compound was increased, an area percentage of the area in which In concentration was 2 to 35 mass % did not satisfy the preferable scope (70% or more) of the invention, which slightly increased the specific resistance of the oxide sintered body.

Further, the above sintered body was used for sputtering method in the same way as Example 1, so that the stable discharge was confirmed. The relative density and specific resistance of the thus-obtained sputtering target were measured in the same way as the above Example 1. The sputtering target of this example was determined to have the relative density of 92% and the specific resistance of $3.0 \times 10^{-2}$ Ω·cm, which were good results. The thin film deposited under the above sputtering conditions was used to measure a carrier mobility in the same way as in Example 1. The carrier mobility was determined to be a high value, specifically, 15 cm$^2$/Vs or more.

Example 7

Example 7 produced the oxide sintered body in the same way as Example 1 except that the above powders of the raw materials were blended at the ratio of [Zn]:[Sn]:[In]=35.0:35.0:30.0, and that a molded body was sintered while being kept at 1450° C.

The results are shown in a specimen No. 7 of Table 1. As shown in Table 1, an area percentage of the area in which Sn concentration was 10 to 50 mass % in the oxide sintered body was 92%, which satisfied the scope (of 70% or more) of the invention. An area percentage of the area in which In concentration was 2 to 35 mass % in the oxide sintered body also satisfied the preferable scope (of 70% or more) of the invention.

Further, the above sintered body was used for sputtering method in the same way as Example 1, so that the stable discharge was confirmed. The relative density and specific resistance of the thus-obtained sputtering target were measured in the same way as the above Example 1. The sputtering target of this example was determined to have the relative density of 98% and the specific resistance of $2.6 \times 10^{-3}$ Ω·cm, which were good results. The thin film deposited under the above sputtering conditions was used to measure a carrier mobility in the same way as in Example 1. The carrier mobility was determined to be a high value, specifically, 15 cm$^2$/Vs or more.

Example 8

Example 8 produced the oxide sintered body in the same way as Example 1 except that the above powers of the raw materials were blended at the ratio of [Zn]:[Sn]:[In]=64.0: 16.0:20.0, and that a molded body was sintered while being kept at 1300° C.

The results are shown in a specimen No. 8 of Table 1. As shown in Table 1, an area percentage of the area in which Sn concentration was 10 to 50 mass % in the oxide sintered body was 72%, which satisfied the scope (of 70% or more) of the invention. An area percentage of the area in which In concentration was 2 to 35 mass % also satisfied the preferable scope of the invention (of 70% or more).

Further, the above sintered body was used for sputtering in the same way as Example 1, so that the stable discharge was confirmed. The relative density and specific resistance of the thus-obtained sputtering target were measured in the same way as the above Example 1. The sputtering target of this example was determined to have the relative density of 98% and the specific resistance of $2.7 \times 10^{-3}$ Ω·cm, which were good results. The thin film deposited under the above sputtering conditions was used to measure a carrier mobility in the same way as in Example 1. The carrier mobility was determined to be a high value, specifically, 15 cm$^2$/Vs or more.

Comparative Example 1

Comparative Example 1 produced the oxide sintered body in the same way as the above Example 1 except that a molded body was sintered while being kept at 800° C. for 5 hours in a furnace and then subjected to the heat treatment at 750° C. for 8 hours in a nitrogen gas atmosphere.

The results are shown in a specimen No. 9 of Table 1. As shown in Table 1, an area percentage of the area in which Sn concentration was 10 to 50 mass % in the oxide sintered body was 64%, which was below the scope (of 70% or more) of the invention. The area percentage of the area in which In concentration is 2 to 35 mass % was 58%, which was below the preferable scope (of 70% or more) of the invention.

Further, the above sintered body was used for sputtering method in the same way as Example 1, which caused abnormal discharge during the sputtering. The relative density and specific resistance of the thus-obtained sputtering target were measured in the same way as the above Example 1. The sputtering target of the comparative example was determined to have the low relative density of about 60% and the specific resistance of 97 Ω·cm. The thin film deposited under the above sputtering conditions was used to measure a carrier mobility in the same way as in Example 1. The carrier mobility was determined to be a low value, specifically, 3.0 cm$^2$/Vs.

As can be seen from the results of the above experiments, the sputtering targets obtained using the oxide sintered bodies of Examples 1 to 8 which satisfied the compositions defined by the invention and which also satisfied the preferable factors of the invention about the composition ratios of metals of the oxide sintered body have very good characteristics, including the high relative density and the low specific resistance. Further, the thin film obtained using the sputtering target has a high carrier mobility, and thus was found to be very useful as the oxide semiconductor thin film.

The invention claimed is:

1. An oxide sintered body, comprising:
powders of zinc oxide, tin oxide, and indium oxide,
wherein when an EPMA in-plane compositional mapping is performed on the oxide sintered body, a percentage of an area in which Sn concentration is from 10 to 50 mass % in a measurement area is 70 area % or more,
wherein
the ratio of [In]/([Zn]+[Sn]+[In]) is from 0.10 to 0.30; and
the ratio of [Sn]/([Zn]+[Sn]) is from 0.33 to 0.60, and
[Zn], [Sn], and [In] represent contents by atomic % of respective metal elements in the oxide sintered body.

2. The oxide sintered body according to claim 1, wherein when the EPMA in-plane compositional mapping is performed on the oxide sintered body, a percentage of an area in which In concentration is from 2 to 35 mass % in a measurement area is 70 area % or more.

3. The oxide sintered body according to claim 1, wherein the oxide sintered body has a relative density of 90% or more, and a specific resistance of 1 Ω·cm or less.

4. A sputtering target, comprising the oxide sintered body according to claim 1, wherein the sputtering target has a relative density of 90% or more, and a specific resistance of 1 Ω·cm or less.

5. The oxide sintered body according to claim 2, wherein the oxide sintered body has a relative density of 90% or more, and a specific resistance of 1 Ω·cm or less.

6. The oxide sintered body according to claim 1, wherein the oxide sintered body is prepared by sintering a mixture of zinc oxide, tin oxide, and indium oxide at a temperature in a range from 1300° C. to 1600° C. in the air or at a temperature in a range from 1050° C. to 1150° C. under pressure.

* * * * *